US007200005B2

(12) United States Patent
Von Gutfeld et al.

(10) Patent No.: US 7,200,005 B2
(45) Date of Patent: Apr. 3, 2007

(54) METHOD AND APPARATUS FOR GENERATING ELECTRICITY USING RECYCLED AIR FROM A COMPUTER SERVER

(75) Inventors: Robert J. Von Gutfeld, New York, NY (US); Michael T. Prikas, North Valley Stream, NY (US)

(73) Assignee: International Business Machines Corporation, Armonk, NY (US)

( * ) Notice: Subject to any disclaimer, the term of this patent is extended or adjusted under 35 U.S.C. 154(b) by 310 days.

(21) Appl. No.: 10/732,337

(22) Filed: Dec. 9, 2003

(65) Prior Publication Data

US 2005/0122679 A1    Jun. 9, 2005

(51) Int. Cl.
*H05K 7/20* (2006.01)
*F03D 9/00* (2006.01)

(52) U.S. Cl. .................. 361/695; 290/55; 454/184
(58) Field of Classification Search ............. 361/695; 290/55; 454/184
See application file for complete search history.

(56) References Cited

U.S. PATENT DOCUMENTS

| | | | | | |
|---|---|---|---|---|---|
| 2,923,225 | A | * | 2/1960 | Massey ...................... 454/363 |
| 3,472,150 | A | * | 10/1969 | Strawsine .................. 454/353 |
| 5,544,012 | A | * | 8/1996 | Koike ........................ 361/695 |
| 5,616,963 | A | * | 4/1997 | Kikuchi ....................... 290/55 |
| 5,632,678 | A | * | 5/1997 | Doelfel ...................... 454/366 |
| 6,206,774 | B1 | * | 3/2001 | Dexter et al. .................. 454/5 |
| 6,574,963 | B1 | * | 6/2003 | Tadayon et al. .............. 60/651 |
| 6,601,390 | B1 | * | 8/2003 | Yazawa et al. ............... 60/650 |
| 6,670,721 | B2 | * | 12/2003 | Lof et al. ...................... 290/44 |
| 6,702,661 | B1 | * | 3/2004 | Clifton et al. ............. 454/184 |
| 6,765,309 | B2 | * | 7/2004 | Tallal et al. ................. 290/55 |
| 6,877,318 | B2 | * | 4/2005 | Tadayon et al. .............. 60/651 |
| 7,001,265 | B1 | * | 2/2006 | Beaty .......................... 454/345 |
| 2003/0133265 | A1 | * | 7/2003 | Kinsey et al. .............. 361/687 |

FOREIGN PATENT DOCUMENTS

| | | | |
|---|---|---|---|
| JP | 07-239141 | * | 9/1995 |
| JP | 2003-120506 | * | 4/2003 |
| WO | WO 03/072938 A1 | * | 2/2002 |

* cited by examiner

*Primary Examiner*—Michael Datskovsky
*Assistant Examiner*—Robert J. Hoffberg
(74) *Attorney, Agent, or Firm*—Patterson & Sheridan, LLP; Kin-Wah Tong, Esq.; Ido Tuchman, Esq.

(57) ABSTRACT

In one embodiment, the invention is a method and apparatus for recycling exhaust air expelled from a computer server (e.g., a unit including microprocessors such as a standard server or a mainframe). In one embodiment, at least one windmill (e.g., a standard windmill or a wind turbine) is driven by the exhaust air from at least one server unit, and the at least one windmill in turn drives a generator. Therefore, energy previously wasted in the form of exhaust is harnessed and reused to provide power to the server system. The method and apparatus also reduce the demand placed on ventilation systems needed to cool server environments, further reducing the amount of energy consumed and/or wasted in the operation of a server system. In one embodiment, the electric power from the generator unit is either recycled into the power grid. In another embodiment, the recycled air is used to charge batteries that might be available as power standby units.

8 Claims, 6 Drawing Sheets

METHOD AND APPARATUS FOR GENERATING ELECTRICITY USING RECYCLED AIR FROM A COMPUTER SERVER

BACKGROUND

The present invention relates generally to the field of energy recycling, and relates more particularly to the recycling of air expelled from computer servers. Specifically, the invention is a method and apparatus for generating electricity using recycled air from a computer server.

As circuits in microchips become denser, an increasing amount of waste heat must be expelled from computers in order to prevent the chips from overheating. This is especially true for large machines such as server units. Typical computer servers are capable of drawing up to approximately 30 kW of power under normal operation. However, a major portion of this energy is not used in the operation of the computer per se, but is rather wasted in the form of heat which must be ventilated, for example by means of a heat sink (e.g., a copper block in contact with the microprocessor chips) or a fan that expels exhaust through the server housing. Other components within the server unit, such as power supplies, amplifiers and motors, also generate excess heat that is typically expelled from the server housing by strong fans that circulate air through the housing. Therefore, a major portion of the heat given off by a server unit in operation constitutes wasted energy.

In some systems, cooling is performed by a strong ventilation system that draws heated air from a large, enclosed area that houses as many as one hundred or more servers (e.g., a server farm). Since each server can consume as much as 30 kW, ventilation of waste heat or energy from such as system can also put a heavy strain on an air conditioning system in the enclosed area housing the servers.

Thus, there is a need in the art for a method and apparatus for recycling exhaust air expelled from a computer server.

SUMMARY OF THE INVENTION

In one embodiment, the invention is a method and apparatus for recycling exhaust air expelled from a computer server. In one embodiment, a generator unit is driven by exhaust from at least one server unit. The electric power from the generator unit is either recycled into the power grid or used to charge batteries that might be available as power standby units. Therefore, energy previously wasted in the form of exhaust is harnessed and reused to provide power to the server system. The method and apparatus also reduce the demand placed on ventilation systems needed to cool server environments, further reducing the amount of energy consumed and/or wasted in the operation of a server system.

In one embodiment, the invention combines air ducts from a plurality of servers into a single duct that exits the roof of a server housing and is directed to one or more propellers, which are in turn connected to a generator unit that supplies power to a power grid or battery.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the invention is a method and apparatus for recycling exhaust air expelled from a computer server (e.g., a unit including microprocessors such as a standard server or a mainframe). In one embodiment, at least one propeller (e.g., a standard windmill or a wind turbine) is driven by the exhaust air from at least one server unit, and the at least one propeller in turn drives a generator. In one embodiment, the electric power from the generator unit is either recycled into the power grid. In another embodiment, the recycled air is used to charge batteries that might be available as power standby units.

Figure 1:
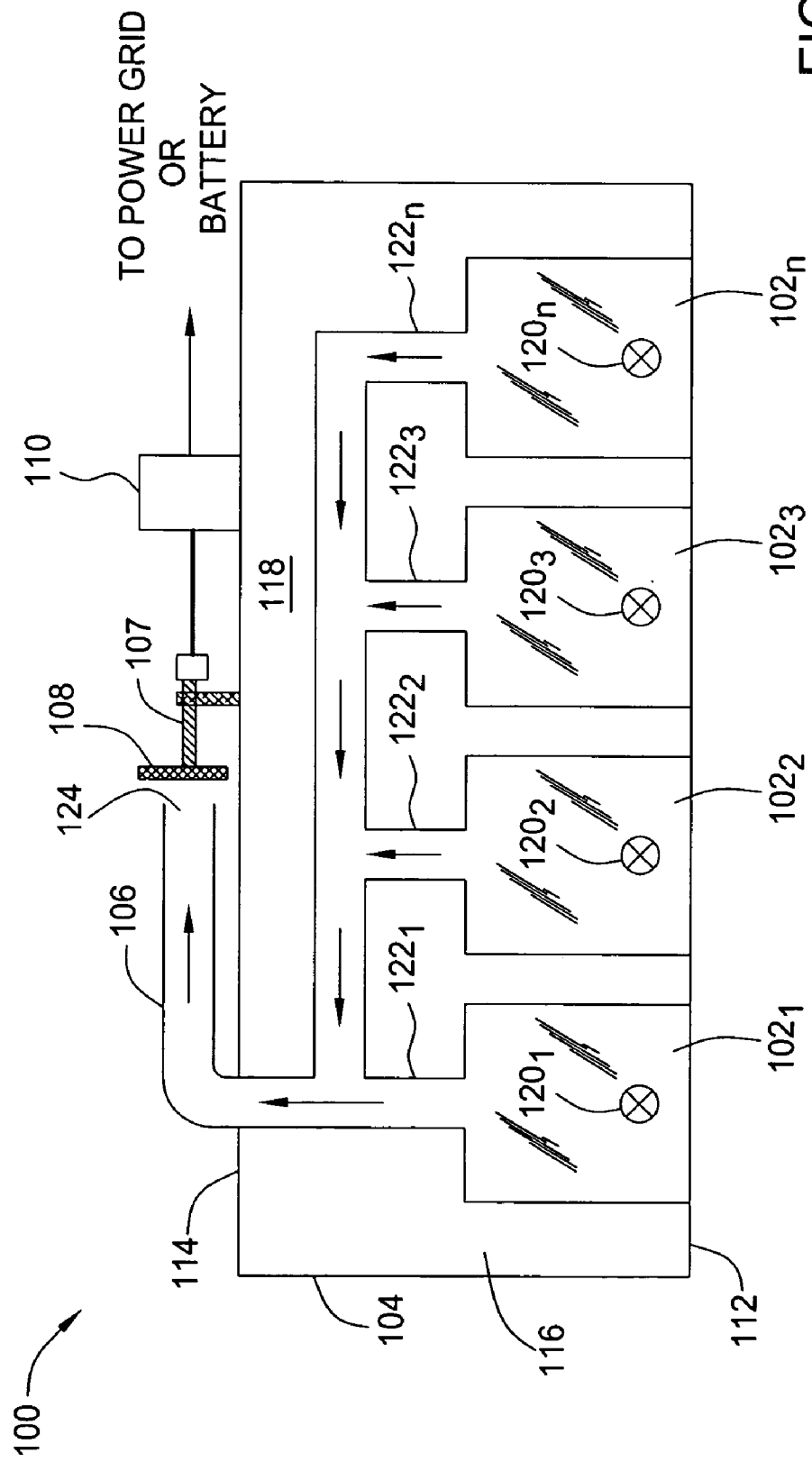
FIG. 1 illustrates a schematic diagram of one embodiment of a system for recycling air expelled by at least one server, in which expelled air is urged toward a vertically orientated propeller.

FIG. 1 is schematic diagram of one embodiment of a system 100 for recycling energy expelled by at least one server $102_{1-n}$, wherein the subscript n is an integer greater than zero and represents the number of servers 102 in the system 100. The system 100 comprises a server housing 104, at least one server $102_{1-n}$ (hereinafter collectively referred to as "servers 102") an exhaust duct 106, a propeller 108 and an electric generator 110.

The server housing comprises a bottom 112, a roof 114 and at least one wall 116 that define a volume 118 therein. Within the volume 118 is housed the at least one server 102. In the embodiment illustrated in FIG. 1, four servers 102 are housed within the server housing 104; however, those skilled in the art will appreciate that any number of servers 102 may be used in the system 100. Each of the servers 102 includes a fan $120_{1-n}$ (hereinafter collectively referred to as "fans 120") and an exhaust port $122_{1-n}$ (hereinafter collectively referred to as "exhaust ports 122").

Each exhaust port 122 is coupled to the common exhaust duct 106. In one embodiment, the common exhaust duct 106 exits the server housing 104 through the roof 114. In another embodiment, the common exhaust duct may exit the server housing 104 at another location (e.g., through a wall 116). The propeller 108 is positioned proximate to an opening 124 in the exhaust duct 106. The term "propeller" will be understood to be any device capable of harnessing wind power to generate electricity, including, but not limited to, a standard windmill (e.g., windmill 600 illustrated in FIG. 6) and a wind turbine (e.g., wind turbine 700 illustrated in FIG. 7). In one embodiment, the propeller 108 is mounted so that an axis 107 of the propeller 108 is orientated substantially parallel to the roof 114 of the server housing 104 (e.g., the blades of the propeller 108 are positioned perpendicular to the roof 114 of the housing 104). In other embodiments, the propeller 108 may be mounted or orientated in an alternate position, depending upon the structure of the common exhaust duct 106 and the location of the opening 124. The propeller 108 is coupled to the electric generator 110, which, in one embodiment, is further coupled to a power grid (not shown). In another embodiment, the electric generator 110 is coupled to at least one rechargeable battery (not shown).

In operation, the fans 120 cool the servers 102 by urging hot air toward the exhaust ports 122, where the air is expelled from the servers 102 and into the common exhaust duct 106. The exhaust duct 106 carries the air out of the server housing 104 and drives the accelerated air toward the propeller 108. The expelled air drives the propeller 108, and the propeller 108 in turn drives the electric generator 110. The electric generator 110 converts the wind power to electricity, which may be supplied to the power grid or to the at least one rechargeable battery.

The air moved through the servers 102 by the fans 120 (e.g., the "waste air") typically constitutes a large amount of kinetic energy; this energy would normally be simply expelled from the servers 102 and into the outside environment in a conventional system. However, the system 100 illustrated in FIG. 1 uses the waste air to drive the propeller 108 and thereby generate electricity that may be used by the system 100 or by other systems. Thus, the system 100 essentially recycles exhaust to generate additional power.

Figure 6:
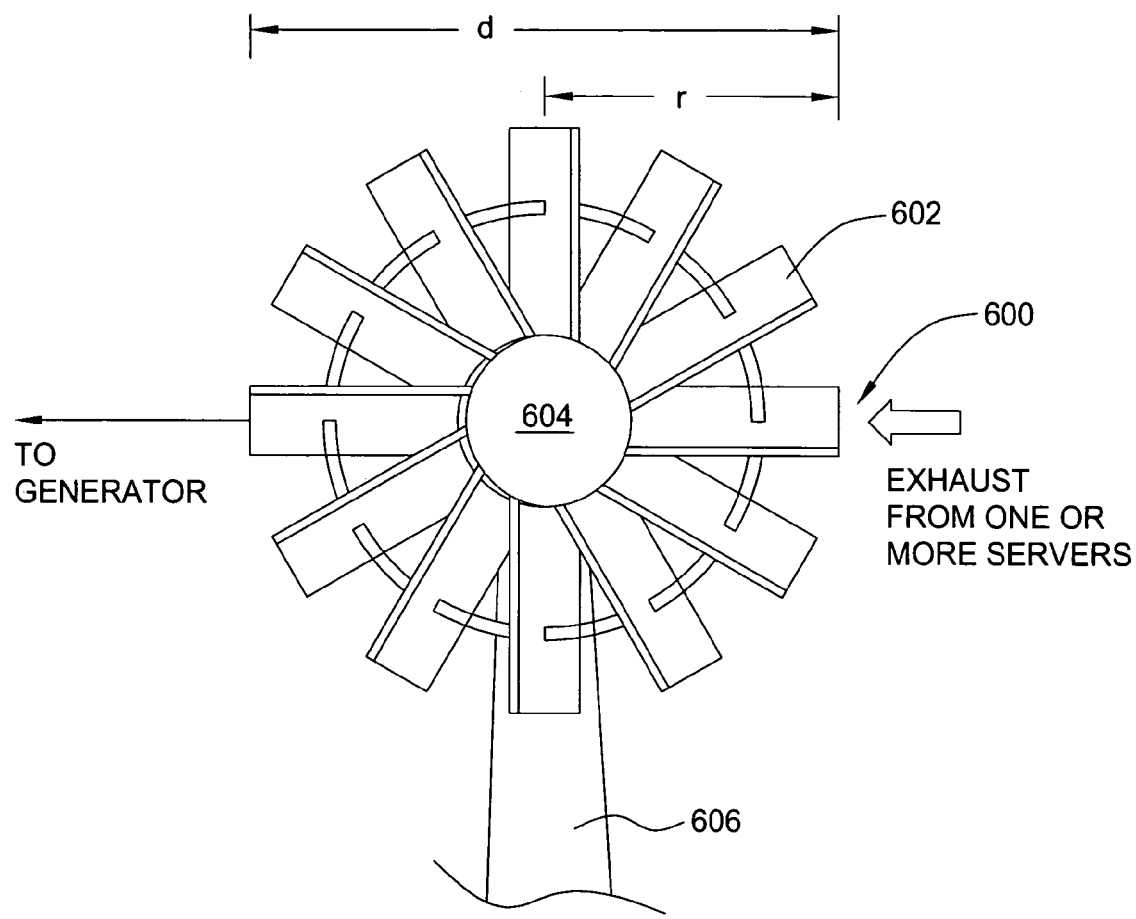
FIG. 6 illustrates an isometric view of one embodiment of a windmill that may be deployed within the systems illustrated in FIGS. 1–5.
Figure 7:
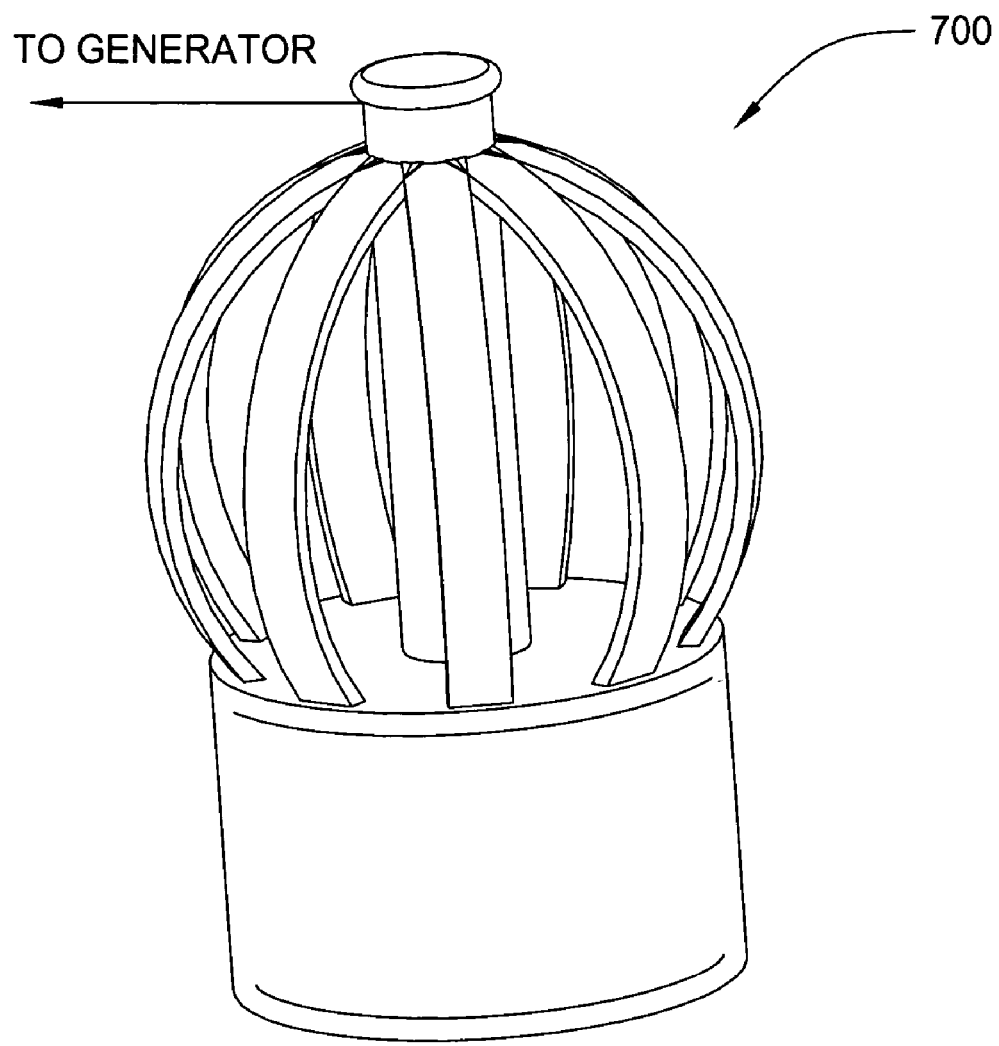
FIG. 7 illustrates an isometric view of one embodiment of a wind turbine that may be deployed within the systems illustrated in FIGS. 1–5.

In one embodiment, the propeller 108 is a windmill such as the windmill 600 illustrated in FIG. 6. The windmill 600 comprises a plurality of blades 602 mounted around the circumference of a hub 604. In one embodiment, the windmill 600 is positioned so that exhaust air from one or more servers is incident upon the windmill 600 at an angle substantially normal to the hub 604 and the plane of the blades 602.

In general, the efficiency of the utilization of the incident exhaust is directly proportional to a diameter d of the windmill 600. Furthermore, the rotation of the blades 602, and hence the energy output from the windmill 600, is generally proportional to the velocity cubed of the incident exhaust. Therefore, in one embodiment, the system 100 comprises at least one large exhaust duct 106 that collects exhaust from one or more servers 102, so that an effective area of incident wind on the windmill 600 is at least equal to the effective area of the extension of the blades 602. Thus, in one embodiment, the effective area of the exhaust duct 106 is at least equal to $\pi r^2$, where r, is the radius of the windmill 600.

In general, the kinetic energy K for a substantially cylindrical column of exhaust having an air mass M incident on the windmill 600 during a time interval of $\Delta t$, is equal to $$K = \frac{1}{2}Mv^2 = \frac{1}{2}(\rho \pi r^2 v \Delta t)v^2 \qquad (EQU. 1)$$

where v is the wind speed of the exhaust air, $\rho$ is the density of air, and $\pi r^2 v \Delta t$ is the size of the substantially cylindrical column of exhaust (e.g., the size of the exhaust duct 106).

A fraction e' of the kinetic energy K can be converted to work W, so that the power P produced by the windmill is approximately $$P = \frac{1}{2} e \rho \pi r^2 v^3 = \Delta W / \Delta t \qquad (EQU. 2)$$

Literature suggests that a typical efficiency e (e.g., ratio of wind power harnessed to electrical power produced) for a windmill is 0.4. The efficiency e will also be impacted by factors such as the geometry of the blades 602, including, for example, parameters of the blades' twist angles. In one embodiment, the conversion of wind (e.g., exhaust) power to electrical power by the system 100 having server fans 120 to create the exhaust is as high as 0.9.

Figure 2:
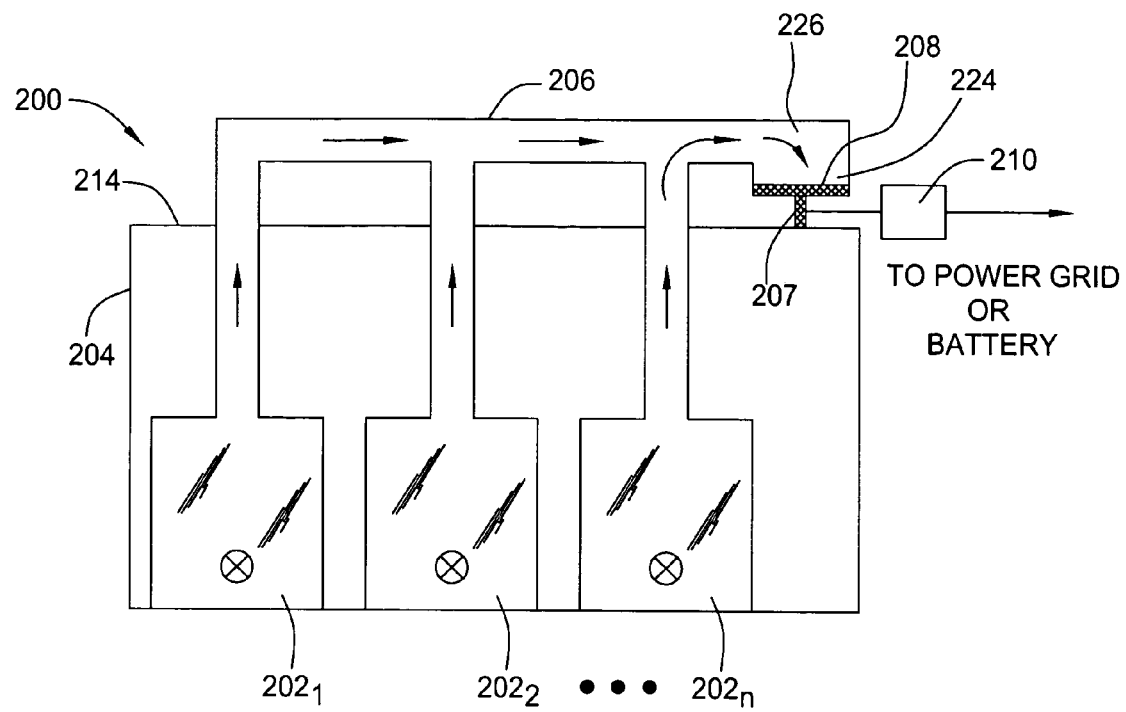
FIG. 2 illustrates a schematic diagram of one embodiment of a system for recycling air expelled by at least one server, in which expelled air is urged toward a horizontally orientated propeller.

FIG. 2 is schematic diagram of another embodiment of a system 200 for recycling air expelled by at least one server $202_{1-n}$. The system 200 is substantially similar to the system 100 illustrated in FIG. 1 and comprises a server housing 204, at least one server $202_{1-n}$ (hereinafter collectively referred to as "servers 202") an exhaust duct 206, a propeller 208 and an electric generator 210. However, unlike the propeller 108 illustrated in FIG. 1, the propeller 208 is mounted so That an axis 207 of the propeller 208 is orientated substantially perpendicular to the roof 214 of the server housing 204 (e.g., the blades of the propeller 208 are positioned horizontally with respect to the roof 214 of the housing 204). In one embodiment, the perpendicular orientation of the propeller 208 as described is advantageous in terms of reducing or preventing the amount of precipitation that may leak into the housing 204. Thus, the exhaust duct 206 comprises an additional bend 226 that enables the opening 224 in the exhaust duct 206 to be positioned substantially over the propeller 208.

Figure 3:
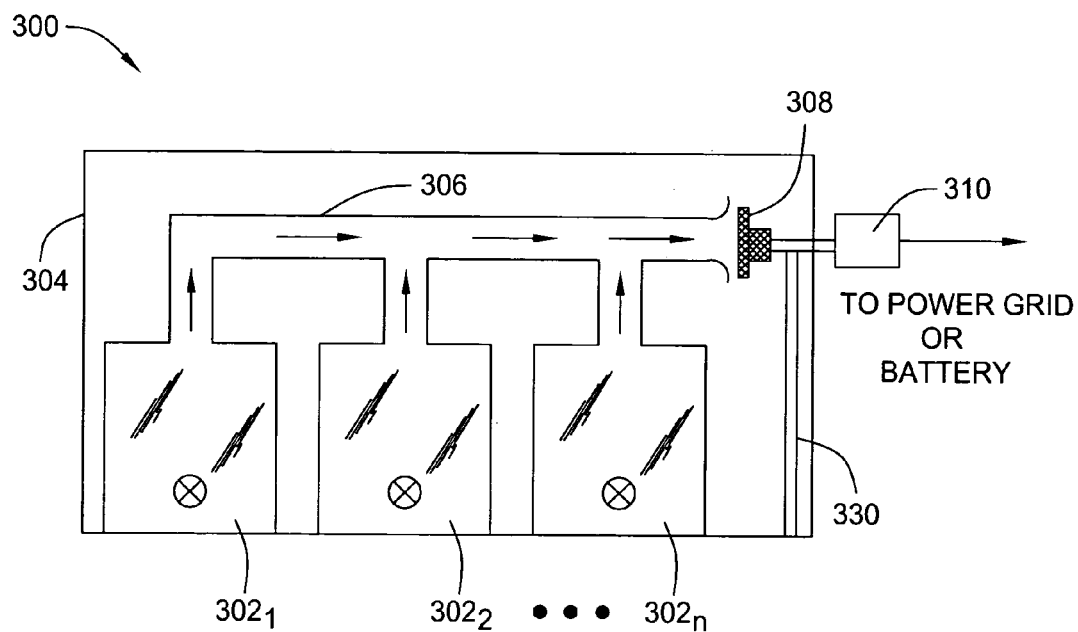
FIG. 3 illustrates a schematic diagram of another embodiment of a system for recycling air expelled by at least one server, in which at least one propeller is housed within the server housing.

FIG. 3 is a schematic diagram of another embodiment of a system 300 for recycling air expelled by at least one server $302_{1-n}$, in which at least one propeller 308 is housed within the server housing 304. The system 300 is substantially similar to the system 100 illustrated in FIG. 1 and comprises a server housing 304, at least one server $302_{1-n}$ (hereinafter collectively referred to as "servers 302") an exhaust duct 306, a propeller 308 and an electric generator 310. However, unlike the embodiment illustrated in FIG. 1, the propeller 308 and common exhaust duct 306 are both positioned substantially entirely within the server housing 304, rather than outside the server housing 304. Thus in the embodiment illustrated in FIG. 3, the server housing 304 is sufficiently high to accommodate the height of the propeller 308 and its blades, for example when the propeller 308 is mounted on a support arm 330.

Figure 4:
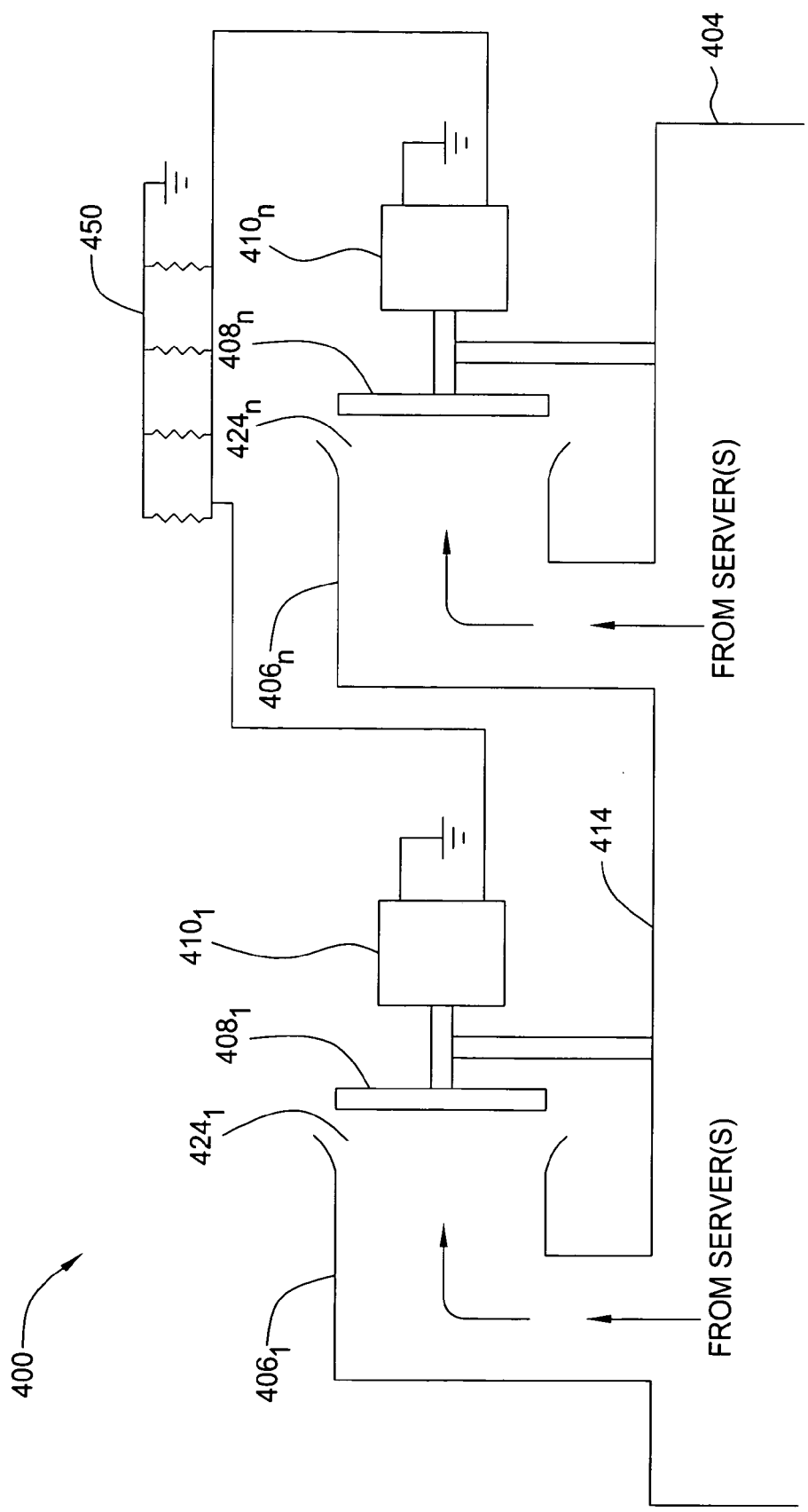
FIG. 4 illustrates a schematic diagram of another embodiment of a system for recycling air expelled by at least one server, in which two or more propellers are employed in parallel to drive two or more generators.

FIG. 4 is a schematic diagram of another embodiment of a system 400 for recycling air expelled by at least one server, in which two or more propellers $408_{1-n}$ are employed in parallel to drive two or more generators $410_{1-n}$. The system 400 is substantially similar to the system 100 illustrated in FIG. 1 and comprises a server housing 404, at least one server (not shown), two or more exhaust ducts $406_{1-n}$ (hereinafter collectively referred to as "exhaust ducts 406"), two or more propellers $408_{1-n}$ (hereinafter collectively referred to as "propellers 408"), and two or more electric generators $410_{1-n}$ (hereinafter collectively referred to as "generators 410").

In one embodiment, the exhaust ducts 406 exit through the roof 414 of the server housing 404 are relatively short, and the openings $424_{1-n}$ of the exhaust ducts 406 are positioned to drive air from the servers toward a vertically mounted propeller 408. In another embodiment, the two or more propellers 408 are mounted horizontally, as illustrated in FIG. 2. Each propeller 408 drives a generator 410. In the embodiment illustrated, the generators 410 supply electricity to a power grid 450. In another embodiment, the generators 410 supply electricity to a rechargeable battery.

Figure 5:
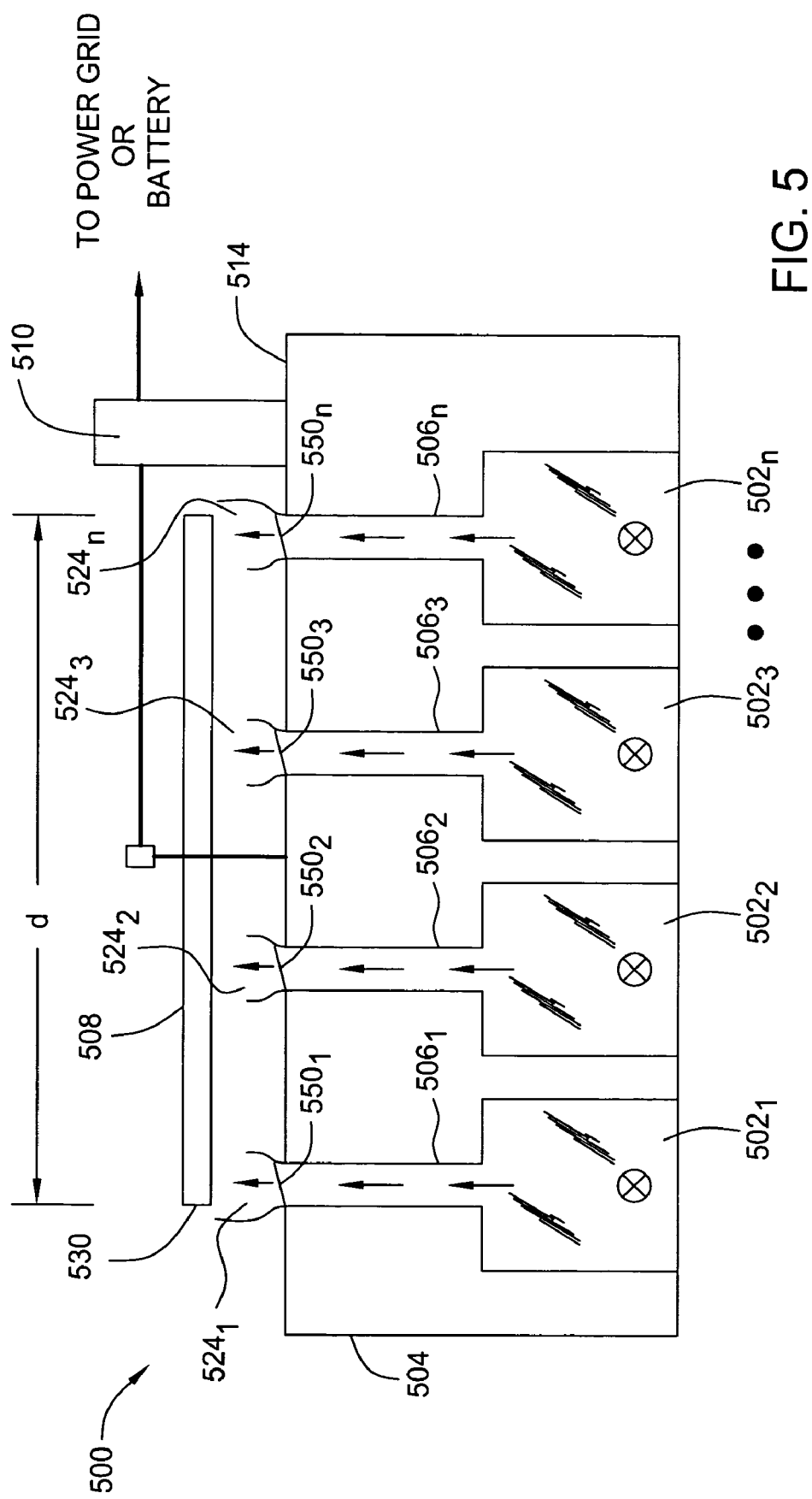
FIG. 5 illustrates a schematic diagram of another embodiment of a system for recycling air expelled by a plurality of servers, in which exhaust from a plurality of exhaust ducts drives at least one large propeller.

FIG. 5 is a schematic diagram of another embodiment of a system 500 for recycling air expelled by a plurality of servers $502_{1-n}$, in which at least one large propeller 508 is employed to drive at least one generator 510. The system 500 is substantially similar to the system 100 illustrated in FIG. 1 and comprises a server housing 504, a plurality of servers $502_{1-n}$ (hereinafter collectively referred to as "servers 502"), a plurality of exhaust ducts $506_{1-n}$ (hereinafter collectively referred to as "exhaust ducts 506"), a large propeller 508, and at least one electric generator 510.

In one embodiment, each of the servers 502 has a respective exhaust duct 506 that exits the server housing 504 through the roof 514, although in other embodiments, the exhaust ducts 506 may exit the server housing 504 through an alternate location. In the embodiment illustrated in FIG. 5, the exhaust ducts 506 define substantially vertical paths (e.g., no bends) that direct exhaust air straight upward toward the propeller 508. In one embodiment, each exhaust duct 506 further comprises a check valve $550_{1-n}$ (hereinafter collectively referred to as "check valves 550") or equivalent mechanism that enables exhaust to flow through an opening $524_{1-n}$ (hereinafter collectively referred to as "openings 524") of the exhaust duct 506, while preventing the entry of elements such as precipitation or air back into the exhaust duct 506 from an outside environment. The large propeller 508 is mounted horizontally on the roof 514 of the server housing 514 and is positioned proximate to the openings 524 of the exhaust ducts 506. The propeller 508 has a large enough diameter d to span all of the server exhaust ducts 506. The openings 524 of the exhaust ducts 506 that are positioned around the circumference 530 of the propeller 508 (e.g., the exhaust ducts $506_1$ and $506_n$ in FIG. 5) are formed to substantially confine exhaust air flow within the area of space beneath the propeller 508. The propeller 508 drives the generator 510, which in one embodiment supplies electricity to a power grid or to a battery.

Thus, the present invention represents a significant advancement in the field of energy recycling and server technology. A method and apparatus are provided that recycle exhaust air expelled from a computer server or group of computer servers. Therefore, energy previously wasted in the form of exhaust is harnessed and reused to provide power to the server system (e.g., to a power grid or a battery). The method and apparatus also reduce the demand placed on ventilation systems needed to cool server environments, further reducing the amount of energy used and/or wasted by a system employing a group of servers. Furthermore, embodiments of the invention may be advantageously adapted for a variety of other applications, namely, applications in which strong currents are ventilated from a system (e.g., steel mills, boiler rooms, among others).

While foregoing is directed to the preferred embodiment of the present invention, other and further embodiments of the invention may be devised without departing from the basic scope thereof, and the scope thereof is determined by the claims that follow.

The invention claimed is:

1. An apparatus comprising:
    a plurality of server units;
    a server housing for housing said plurality of server units, where said server housing comprises a bottom, at least one wall coupled to said bottom, and a roof coupled to said at least one wall, positioned distal from said bottom;
    at least one exhaust duct having a first end and a second end, wherein said first end is coupled to each of said plurality of server units and said second end has an opening positioned distal from said first end, said at least one exhaust duct being adapted for removing exhaust air from said at least one server unit, wherein each of said plurality of server units has a respective exhaust port coupled to said at least one exhaust duct, wherein said second end of said at least one exhaust duct exits said server housing, wherein said opening of said at least one exhaust duct is positioned to expel exhaust air in a direction substantially toward said roof of said server housing;
    at least one propeller positioned proximate to said opening, said at least one propeller adapted to be driven by said exhaust air exiting said at least one exhaust duct, wherein said at least one propeller is mounted to said roof of said server housing, wherein said at least one propeller is mounted vertically with respect to the roof housing; and
    at least one generator coupled to said at least one propeller, adapted for being driven by said at least one propeller, wherein said at least one propeller and at least one generator are exterior to said server housing.

2. The apparatus of claim 1, wherein said second end of said at least one exhaust duct is contained substantially within said server housing.

3. The apparatus of claim 1, wherein said opening of said at least one exhaust duct is positioned to expel exhaust air in a direction substantially parallel to said roof of said server housing.

4. The apparatus of claim 1, wherein said at least one propeller is a windmill.

5. The apparatus of claim 1, wherein said at least one propeller is a wind turbine.

6. The apparatus of claim 1, wherein said at least one generator is coupled to a power grid.

7. The apparatus of claim 1, wherein said at least one generator is coupled to at least one battery.

8. The apparatus of claim 1, wherein said server unit is a mainframe.

* * * * *